US007161280B2

(12) United States Patent
Brun

(10) Patent No.: US 7,161,280 B2
(45) Date of Patent: Jan. 9, 2007

(54) ULTRASONIC TRANSDUCER AND METHOD OF JOINING AN ULTRASONIC TRANSDUCER

(75) Inventor: Esben Groenborg Brun, Soenderborg (DK)

(73) Assignee: Siemens Flow Instruments A/S, Nordborg (DK)

( * ) Notice: Subject to any disclaimer, the term of this patent is extended or adjusted under 35 U.S.C. 154(b) by 0 days.

(21) Appl. No.: 10/497,274

(22) PCT Filed: Nov. 27, 2002

(86) PCT No.: PCT/DK02/00794

§ 371 (c)(1), (2), (4) Date: Nov. 12, 2004

(87) PCT Pub. No.: WO03/045586

PCT Pub. Date: Jun. 5, 2003

(65) Prior Publication Data

US 2005/0061084 A1 Mar. 24, 2005

(30) Foreign Application Priority Data

Nov. 30, 2001 (DK) ............................... 2001 01780

(51) Int. Cl.
*H01L 41/04* (2006.01)
*H02N 2/00* (2006.01)

(52) U.S. Cl. .................. 310/334; 310/323.21; 310/337

(58) Field of Classification Search ................ 310/328, 310/369, 348, 323.21, 334, 337; 367/155, 367/157, 147, 163
See application file for complete search history.

(56) References Cited

U.S. PATENT DOCUMENTS 4,011,473 A 3/1977 Massa
4,800,316 A * 1/1989 Ju-Zhen ...................... 310/327
4,907,207 A * 3/1990 Moeckl ...................... 367/140

(Continued)

FOREIGN PATENT DOCUMENTS

DE 28 01 332 A1 7/1978

(Continued)

OTHER PUBLICATIONS

Jesper Schmidt Hansen and Dr.-Ing. Jean Bruland, "Verbessem der Buckelschweisseneignung durch metallische Überz üge am Beispiel von Werkstoffen mit unterschiedlichen Eigenschaften", Sondetagung Widerstandsschweissen Conference, May 7-8, 1998, pp. 1-8, Duisburg, GERMANY.

*Primary Examiner*—Tom Dougherty
*Assistant Examiner*—J. Aguirrechea

(57) ABSTRACT

The invention concerns an ultrasonic transducer, which is assembled from several parts. These parts are a protecting plate, a piezoelectric disc and a housing. Joining of the parts for transducers are normally done by means of TIG welding or laser welding, but these are relatively costly processes, which also has an impact on the transducer, especially the piezoelectric disc, due to the heat. In order to reduce the heat load and simultaneously simplify manufacturing an ultrasonic transducer is suggested, in which the protecting plate and the housing consists of electrically conducting materials of different kinds and where joining of housing and plate is done by using a mechanical force influence and an electrical current which flows through plate and housing. Also, a method for joining the parts of an ultrasonic transducer is described.

11 Claims, 2 Drawing Sheets

U.S. PATENT DOCUMENTS

| | | | | |
|---|---|---|---|---|
| 5,297,553 | A * | 3/1994 | Sliwa et al. | 600/459 |
| 5,363,341 | A | 11/1994 | Schwald et al. | |
| 6,353,277 | B1 * | 3/2002 | Hahn-Jose | 310/324 |
| 6,870,304 | B1 * | 3/2005 | Magnussen et al. | 310/323.02 |
| 6,989,625 | B1 * | 1/2006 | Suzuki et al. | 310/334 |
| 2001/0012239 | A1 * | 8/2001 | Tajima | 367/155 |
| 2002/0003385 | A1 * | 1/2002 | Jones | 310/334 |
| 2002/0124662 | A1 * | 9/2002 | Suzuki et al. | 73/861.28 |

FOREIGN PATENT DOCUMENTS

| | | | |
|---|---|---|---|
| DE | 89 07 552 | U1 | 8/1989 |
| DE | 43 30 747 | C1 | 2/1995 |
| DE | 100 45 646 | A1 | 4/2002 |
| EP | 0 477 575 | A1 | 4/1992 |
| EP | 0 589 396 | A1 | 3/1994 |
| EP | 0 815 954 | A2 | 1/1998 |
| JP | 11136061 | A | 5/1999 |
| JP | 11168349 | A | 6/1999 |
| JP | 2000236228 | A | 8/2000 |

* cited by examiner

ULTRASONIC TRANSDUCER AND METHOD OF JOINING AN ULTRASONIC TRANSDUCER

CROSS REFERENCE TO RELATED APPLICATIONS

This application is the US National Stage of International Application No. PCT/DK02/00794, filed Nov. 27, 2002 and claims the benefit thereof. The International Application claims the benefits of Danish application No. PA200101780 filed Nov. 30, 2001, both of the applications are incorporated by reference herein in their entirety.

FIELD OF INVENTION

The invention relates to an ultrasonic transducer for use at transmission of a sound in fluidic media. Transducers of this type are used in ultrasonic flowmeters which function according to either the transit-time principle or to the Doppler principle. The invention will primarily be used in ultrasonic flowmeters for liquids working according to the transit-time principle, however, it can be used in different types of ultrasonic flowmeters.

BACKGROUND OF INVENTION

Ultrasonic flowmeters that work according to the transit-time principle include one or more sets of ultrasonic transducers between which a sound is transmitted. The transducers alternately act as transmitters and receivers of ultrasound. Fundamentally, a transducer consists of a piezoelectric element which transforms electric energy into sound and reversely sound into electric energy. The piezoelectric element is placed in a housing, typically stainless steel. The piezoelectric element is normally not resistant to the flowing fluid, for example district heating water. Therefore, the piezoelectric element is protected by a plate, also called a "window", which is placed on the housing. This protecting plate or window is made of a resistant material, typically stainless steel. "Plate" hereafter means that part of the ultrasonic flowmeter through which the ultrasound is transmitted from the piezoelement to the liquid. The plate can be integrated in the measuring pipe itself, but typically the plate is part of a discrete transducer which is mounted in the measuring pipe.

The plate can be made of stainless steel comprising molybdenum which is the case for most of the ultrasonic flowmeters within the sector for energy metering, especially used for district heating measurement. Other ultrasound transducers have protection plates made of aluminium brass.

The ultrasonic transducer thus consists of two parts which are to be joined. When the two parts are made of stainless steel, they can be welded together by means of TIG welding (Tungsten Inert Gas), electron beam welding or laser welding. Alternatively the two parts can be joined together through soldering. These are the known thermal processes when the ultrasonic transducer parts are to be joined, but these processes are relatively complicated, expensive and time-consuming. Further, it is often problematic to control the temperature so that vital parts such as the piezoelectric disc are not destroyed. Cracking for example, is a well-known and widespread problem in connection with laser welding, and it is especially a problem on that type of ultrasonic transducers which have the piezolelectric disc placed in close—direct or indirect—mechanical and electrical contact with the plate. This close acoustical contact is necessary in order to transmit ultrasonic waves into the fluid.

SUMMARY OF INVENTION

In the light of the above the object is to join an ultrasonic transducer consisting of several parts in a simpler, faster and more lenient way than what is described in the prior art.

The ultrasonic transducer contains a housing and a piezoelectric disc which is placed in contact with the protecting plate and the object is reached in that the housing and the protecting plate consist of electrically conducting materials, where the material used for the housing is different from the material used for the protecting plate, and that the plate and the housing are joined in a thermal process by applying a mechanical force action and an electric current, the latter being conducted through the plate and the housing.

The housing and the plate of the ultrasonic transducer are thus joined in a thermal joining process where the heat generation is caused by conducting an electrical current through the parts that are to be joined. Therefore, both housing as well as plate must be electrically conductive. Using the invention is has surprisingly turned out, that even though plate and piezoelectric disc are in close mechanical contact with each other during the joining process, the disc will not be thermally overloaded. Further, nor does the acoustic intermediate layer, which usually is placed between plate and disc, suffer, e.g. due to evaporation. The advantage in making use of an electrically based thermal joining process is that it gives a considerable lower heat input than compared to other welding methods. This increases the design possibilities of the transducer as the piezoelectrical disc can now be glued onto the plate whereafter joining can be done without affecting the glue strip considerably. This also applies to the use of grease instead of glue. The process is also faster than the manufacturing processes that have been used so far. The mechanical-electrical-thermal joining process is generally known under the name resistance welding or pressure welding, but also resistance soldering is a possibility. The temperature during joining can be lower or higher than the melting points of the used materials. Joining can take place with a melting zone in the parts used, whereby an actual welding and soldering takes place, or without melting zones causing a solid phase joining of the parts. Dependent on the process parameters there is a sliding transistion between the two cases. Resistance welding is well described in a paper at the conference "Sondertagung Widerstandsschweissen" by J. S. Hansen and J. Bruland, Danfoss A/S: "Verbessern der Buckelschweissneigung durch metallische Überzüge am Beispiel von Werkstoffen mit unterschiedlichen Eigenschaften", Düisburg, Germany, 7 and 8 May 1998. In selecting the plate and the housing in different materials a simplified manufacture is achieved. A considerable drawback with known methods as laser and TIG welding is that they can not be used for e.g. copper alloys and not for joining materials which are of different kinds. Thus, a characteristic of the invention is that the plate and the housing can be chosen in different kinds of material. Mechanical joining methods like flanging, threading and the like are possible alternatives, but resistance welding, respectively resistance soldering, gives a better tightness and is mechanically and geometrically more simple. Thus, an inexpensive material can be used for the housing and another material for the plate, the latter material fulfilling the specifications for transmission.

A particularly good joining between the housing and the plate is obtained by surface coating one or both parts before joining. For example, in a chemical dip process or in an electrochemical bath the plate can be provided with a coating, and this coating is melted during the joining process by the high current and thereby functions as soldering material. This will result in a close tightening and a mechanically durable bond.

The surface layer essentially consists of nickel or a combination of nickel and phosporus.

The housing of the ultrasonic transducer preferably consists of a copper alloy whereby brass is particularly preferred. It is less costly to manufacture a housing in brass than in stainless steel because metal cutting of brass is much easier. The manufacturing cost is about half of the price for stainless steel. Besides, it is possible to manufacture the brass housing through hot pressing with subsequent processing. At high numbers of work pieces this loweres the manufacturing cost further. If at the same time this combination of material is followed up by a surface coating as described above, a particularly corrosion resistant ultrasonic transducer is obtained.

In order to facilitate the joining process e.g. a ring for soldering can be placed between the housing and the plate.

In order to establish a good electrical contact between the piezoelectric disc and the protecting plate, the coating on the side of the plate that faces the disc can be made in a way that it exhibits a number of noses consisting of coating material. These noses protrude through the acoustic coupling layer, for example grease, and ensure a better transmission of the generated respectively received signal. The noses are made by applying a mask which has holes to the plate before coating. This can for example be done by using silk-screen printing. When the mask is removed, the remaining parts will function as protruding noses.

The height of the noses should be chosen in a way that the maximum signal amplitude from the piezoelectric disc to the fluid is obtained. This height is dependent on the acoustic coupling material, but has dimensions from 1 to 50 μm.

Instead of noses a projection can be made on the side of the plate that faces the piezoelectric element. Such projection can for example be a circle which has an edge height of 10 μm and a top width of 3 μm.

Another way to establish the electrical contact is to add small metal particles to the layer of grease that is placed between the plate and the piezolelement.

Further, the object is achieved through a method for joining an ultrasonic transducer where the method comprises joining the protecting plate, which consists of a first material kind, and the housing, which consists of a second material kind, in a thermal process by using a mechanical force and an electric current which is conducted through the plate and the housing, which consists of electrically conducting materials.

BRIEF DESCRIPTION OF THE DRAWINGS

In the following an embodiment of the invention is described with reference to the figures, where.

DETAILED DESCRIPTION OF INVENTION

Figure 1:
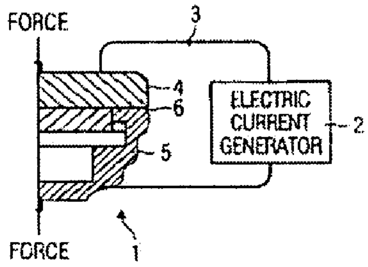
FIG. 1 is a schematic showing the technique used for joining the parts of the ultrasonic transducer

FIG. 1 is a schematic which shows how the ultrasonic transducer parts are joined according to the invention. A part of the ultrasonic transducer 1 is via conductors 3 connected to an electrical current generator 2. A mechanical force "Force" acts on the housing with a force of about 600 N, while the current generator sends a current of about 4 kA through plate 4 and housing 5. The thermal joining takes place in the contact area 6, which in this embodiment is annular. In other words, the protecting plate is welded in a circle onto the housing. Thus, local heating in the points of contact is created due to the electrical contact resistance when the parts are brought into contact with each other. The housing 5 preferably consists of dezincification resistant brass, while the plate 4 is made of stainless steel. Other combinations of materials are also possible. Thus, different kind of materials as free-cutting steel (i.e.machining steel) and stainless steel can be joined in a resistance welding process. Free-cutting steel is choosen as material for the housing, while stainless steel is used for the plate. Free-cutting steel is considerably less costly, and the housing can possibly be coated with a corrosion protecting coating prior to first use of the ultrasonic transducer. Also aluminium-bronze can be used as material for the plate, but there are constrictions as to the choice of material as the attenuation of the sound wave during transmission through the plate must not be too high.

The advantage of a transducer housing made of brass is that it is considerably less expensive than stainless steel because the metal cutting is much easier respectively quicker in brass, about half the price. It is also possible to manufacture the brass part through hot pressing and subsequent finishing which can be even more inexpensive.

Dezincificated resistant brass is in general the material that is most often used for small ultrasonic heat energy meters. The reason is that it can be shaped with hot forging, which is a low cost and good process, in many cases better than casting. Dezincificated resistant brass has as far as we know not earlier been used for ultrasonic transducers.

Before the current based thermal joining process is performed either the housing or the plate or both are surface modified in a galvanic and/or a chemical wet process where precipitation takes place. By coating the workpieces with nickel or a combination of nickel and phosporus (NiP) the joint and the joining process is considerably improved.

When combining stainless steel with brass having a NiP coating, the NiP coating melt because it has a relatively low melting point (880–950° C.)—lower than the two other metals. In general resistance welding can also be made without actually melting the materials, i.e. as a solid phase joining process, as diffusion-bonding, as friction-welding, as stir-friction-welding or as ordinary forge-welding.

A variant of the invention is to join an ultrasonic transducer by using resistance soldering, which means that a soldering material such as a soldering ring or a soldering paste is introduced between the plate and the transducer housing. However, the process is the same as for the resistance welding and can be carried out in the same machine that is used for resistance welding. Besides, there is a sliding transistion between resistance soldering and resistance welding.

Figure 2:
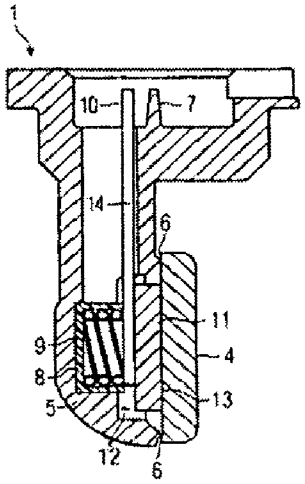
FIG. 2 is as a cut away view showing an ultrasonic transducer according to the invention

FIG. 2 shows in a cut away view an ultrasonic transducer of the angular type. Between the piezoelectric disc 11 and the plate 4 an acoustic coupling layer 13 is placed. This layer can be a soldering layer, glue or grease. The layer serves to improve the sound transmission from the disc through the plate to the medium. The piezoelectric disc must be in close contact with plate 4. A spring 9 keeps with its force the disc in place. The spring is placed in an electrically insulating synthetic housing 8 and has an arm 14 which at the same time pushes the disc into place and works as an electrical terminal. The electrical signal to and from the piezoelectric disc is conducted via a connection 10 on the arm 14, while the ground cable is soldered to a terminal 7. The terminal 7 is an integrated part of the house and is an easy, inexpensive and reliable way to obtain ground contact.

It is known to use a thin plate 4, typically of stainless steel, and these have as a rule a thickness of 0.05–0.1 mm. The advantage of a thin plate is a good transducer function (great sensitivity and low Q). The disadvantage is a considerable sensitivity to mechanical influence such as fluid pressure, wear, water shock, etc. The thin plate requires that the piezoelectric disc is able to transfer the fluid pressure to a "backing" which can match the fluid pressure, and this complicates the construction.

It is also known to use a thick plate. A typical construction is stainless steel with a thickness corresponding to half a wavelength of the sound in the plate, that is about 3 mm for stainless steel at 1 MHz sound frequency which is typically used. It is also known to use a plate of aluminium bronze with a thickness of about 0.8 mm.

The material of the plate is not important with regard to the price, because the plate is geometrically simple (a circular window) and, therefore, inexpensive to manufacture regardless of the kind of material used. Summing up, a thick plate of stainless steel is preferred because it is especially well suited for resistance welding in combination with brass.

It is advantageous to use grease as an acoustic contact medium between plate and piezoelectric disc. Grease-coupling is less costly and simpler than the alternative gluing, which requires an especially thorough surface treatment and can be problematic as regards the environment in the manufacturing area.

As mentioned above it is advantageous that the process of resistance welding produces a very low heat input—in this way grease and the piezoelectric disc can be mounted before the welding without the risc of heating the grease too much. Furthermore, no consideration is to be taken as to the melting point of the polymeric housing 8. The invention can be used in connection with all above mentioned embodiments of the plate.

Figure 3A:
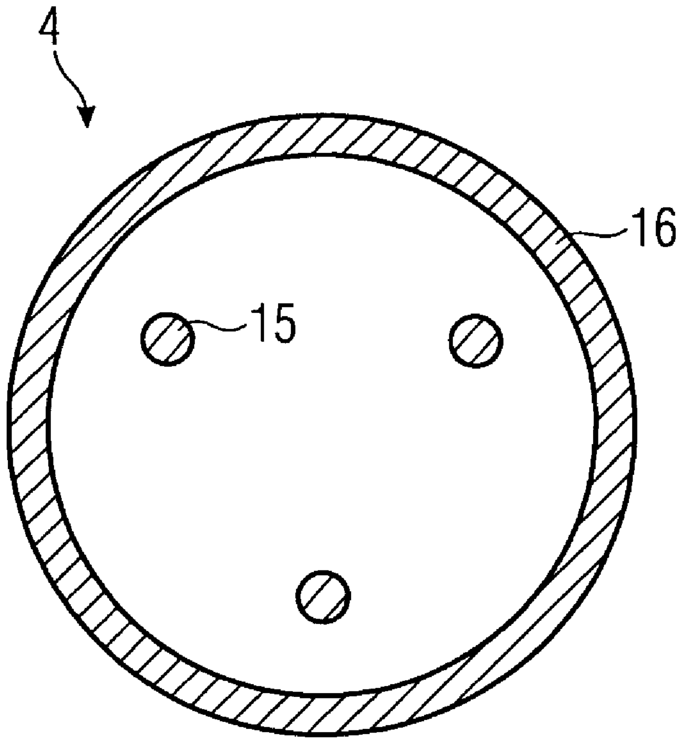
FIGS. 3*a* and 3*b* shows an inventive embodiment of the protection plate
Figure 3B:
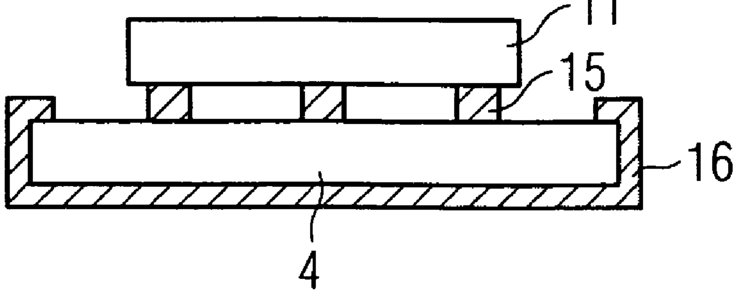

FIG. 3*a* shows an embodiment of the plate 4 where it has separately protruding projecting noses 15. The task of the noses is to ensure electrical contact between disc and plate. These noses are produced through a mask process, for example by means of silk-screen printing, and has a height which gives an optimum sound transmission from the piezoelectric disc through the acoustical coupling layer to the plate and then on to the medium. The height is in the area of 1 to 50 μm and depends on the acoustic coupling layer chosen. For a special kind of grease the preferred height is 10 μm +/−5 μm. The plate 4 exhibits a surface coating 16 which is produced at the same time as the projecting noses 15. FIG. 3*b* shows a piezoelectric disc 11 and the plate 4 in a cut away view.

Another way to ensure a good electrical contact is to make electrically conducting projections in the plate on the side that faces the piezoelectric disc. Such a projection can consist of a projecting ring which for example has a height of 10 μm and a width of 5 μm. This projection functions as spacer between the disc and the plate.

If grease is chosen as the acoustic coupling media, small metal particles can be added. These particles or balls enhance the electrical conductivity in the grease and thereby the signal transmission, and at the same time act as spacers to the plate.

The invention is particularly to be used in district heating meters which can be produced with "direct" sound transmission or with a number of reflections where the sound transmission is controlled by means of a number of sound mirrors.

The invention claimed is:

1. An ultrasonic transducer for use in transmitting sound in a gas or a liquid where the transducer comprises a housing containing a piezoelectric disc which acts as an oscillation element, and which is placed in contact with a protecting plate characterized in that the protecting plate and the housing are manufactured of electrically conducting materials, and the protecting plate comprises one or more electrically conducting projecting noses on a side of the plate that faces the piezoelectric disc.

2. The ultrasonic transducer according to claim 1, wherein the noses have a height which gives an optimum sound transmission to the liquid or the gas.

3. The ultrasonic transducer according to claim 1, wherein an acoustic coupling layer is placed between disc and plate.

4. The ultrasonic transducer according to claim 3, wherein the acoustic coupling layer is mixed with metal particles which have a size of 1–50 μm is placed between the piezoelectric disc and the protecting plate.

5. The ultrasonic transducer according to claim 1 wherein the plate and the housing are joined in a thermal process through the action of a mechanical force and an electrical current which is conducted through the plate and the housing after the piezoelectric disc is attached to the protecting plate.

6. The ultrasonic transducer according to claim 5, wherein the thermal process comprises resistance welding, and the piezoelectric disc is attached to the protecting plate by grease prior to the thermal process.

7. An ultrasonic transducer for use in transmitting sound in a gas or a liquid, comprising:

a protecting plate;

a housing containing a piezoelectric disc which acts as an oscillation element, and which is placed in contact with the protecting plate, wherein the protecting plate and the housing are manufactured of electrically conducting materials, and wherein the protecting plate on the side that faces the piezoelectric disc comprises an electrically conducting projection that spaces the piezoelectric disc from the protecting plate and provides electrical conduction between the piezoelectric disc and the protecting plate.

8. The ultrasonic transducer according to claim 7, wherein the plate and the housing are joined in a the thermal process accomplished by a mechanical force and an electrical current which is conducted through the plate and the housing, and wherein the piezoelectric disc is attached to the protecting plate prior to the thermal process.

9. The ultrasonic transducer according to claim 8, wherein the piezoelectric disc is attached to the protecting plate by glue or grease prior to the thermal process.

10. The ultrasonic transducer according to claim 7, wherein an acoustic coupling layer is placed between disc and plate.

11. The ultrasonic transducer according to claim 10, wherein the acoustic coupling layer is mixed with metal particles which have a size of 1–50 μm is placed between the piezoelectric disc and the protecting plate.

* * * * *